United States Patent [19]

Tahara et al.

[11] Patent Number: 4,680,600
[45] Date of Patent: Jul. 14, 1987

[54] SEMICONDUCTOR DEVICE

[75] Inventors: Akinori Tahara, Zushi; Hiromu Enomoto, Kawasaki; Yasushi Yasuda, Machida, all of Japan

[73] Assignee: Fujitsu Limited, Kanagawa, Japan

[21] Appl. No.: 921,811

[22] Filed: Oct. 21, 1986

Related U.S. Application Data

[63] Continuation of Ser. No. 625,156, Jun. 27, 1984, abandoned.

[30] Foreign Application Priority Data

Jun. 30, 1983 [JP] Japan ................................ 58-116954

[51] Int. Cl.⁴ ..................... H01L 29/56; H01L 29/90; H01L 27/04
[52] U.S. Cl. ........................................ 357/15; 357/13; 357/48
[58] Field of Search ............................ 357/13, 15, 48

[56] References Cited

U.S. PATENT DOCUMENTS 4,110,775  8/1978  Festa ................................... 357/15
4,276,556  6/1981  Enomoto et al. ..................... 357/48

FOREIGN PATENT DOCUMENTS 2855816  12/1979  Fed. Rep. of Germany ........ 357/40
57-183065  11/1982  Japan ................................. 357/40

OTHER PUBLICATIONS

"The Bipolar Digital Integrated Circuits Data Book for Design Engineers", Part 1, 1981, Japan, Texas Instruments Incorporated, p. 6-3 & p. 6-9.

Primary Examiner—Martin H. Edlow
Assistant Examiner—John Lamont
Attorney, Agent, or Firm—Armstrong, Nikaido, Marmelstein & Kubovcik

[57] ABSTRACT

A semiconductor device such as a TTL-type integrated circuit device which has an input protection circuit for each inner circuit, e.g., each TT logic gate. The input protection circuit is formed on a semiconductor substrate of a first conductivity type, and includes a first impurity region having a second conductivity type connected to an external terminal and an island-shape formed on the semiconductor substrate surrounded by an isolation region having the first conductivity type. The device also includes a clamp diode formed on an electrode layer contacting with the first impurity region. The device further includes a PN junction type protection diode formed on a second impurity region having the first conductivity type; the protection diode crosses the first impurity region between the clamp diode and a portion of the first impurity region connected to the external terminal and reaches the isolation region. The reverse withstand voltage of the PN junction type protection diode is smaller than that of the clamp diode, thereby preventing excessive reverse current flow and avoiding permanent destruction of the clamp diode.

7 Claims, 7 Drawing Figures

SEMICONDUCTOR DEVICE

This application is a continuation of application Ser. No. 625,156 filed June 27, 1984 now abandoned.

BACKGROUND OF THE INVENTION (1) Field of the Invention

The present invention relates to a semiconductor device, and more particularly, to a semiconductor device in which the withstandability against destruction by an electrostatic voltage applied to an external terminal is improved.

(2) Description of the Prior Art

A conventional TTL type integrated circuit device comprises an input protection circuit for each inner TTL type logic circuit. Each input protection circuit comprises a Schottky barrier type clamp diode connected between an external input terminal and a power terminal, e.g., ground. The clamp diode turns on when a negative voltage is applied to the external input terminal due to, for example, noise, and protects the inner TTL type logic circuit.

When an excessive positive voltage is applied to the external input terminal due to, for example, electrostatic voltage, the Schottky barrier type clamp diode enters a breakdown state, to protect the internal circuits by preventing the application of a high voltage thereto.

However, in the above-mentioned conventional semiconductor device, if a relatively high positive voltage is applied to the external input terminal, the Schottky barrier type clamp diode is sometimes permanently destroyed, and is short-circuited due to an excessive current flowing therethrough.

SUMMARY OF THE INVENTION

In view of the aforementioned problems of the conventional device, the present invention adopts an idea of forming, in a semiconductor device, a PN junction having a low reverse withstand or breakdown voltage in parallel with a Schottky barrier type clamp diode formed between an input terminal and the ground.

It is an object of the present invention to improve the withstandability against electrostatic destruction and to increase the reliability of a semiconductor device.

According to the present invention, there is provided a semiconductor device formed on a semiconductor substrate having a first conductivity type and having an input circuit for protecting an internal circuit, the input circuit comprising: a first impurity region having a second conductivity type connected to an external terminal and having an island-shape formed on the semiconductor substrate and surrounded by an isolation region having the opposite conductivity; a clamp diode comprising an electrode layer in contact with the first impurity region; and a PN junction type protection diode comprising a second impurity region having the first conductivity type which crosses the first impurity region between the clamp diode and a portion of the first impurity region connected to the external terminal and which reaches the isolation region; the reverse withstand voltage of the PN junction type protection diode being smaller than that of the clamp diode.

DESCRIPTION OF THE PREFERRED EMBODIMENTS

Before describing the preferred embodiments, an explanation will be given of a conventional semiconductor device with reference to the accompanying drawings.

Figure 1:
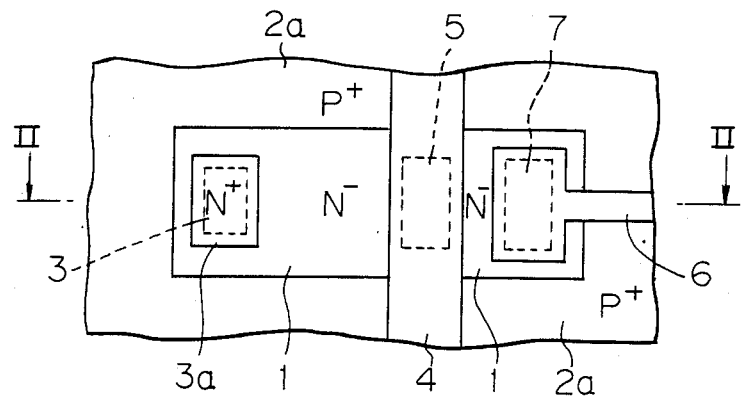
FIG. 1 is a plan view illustrating a structure of an input protection circuit portion of a conventional semiconductor device.
Figure 2:
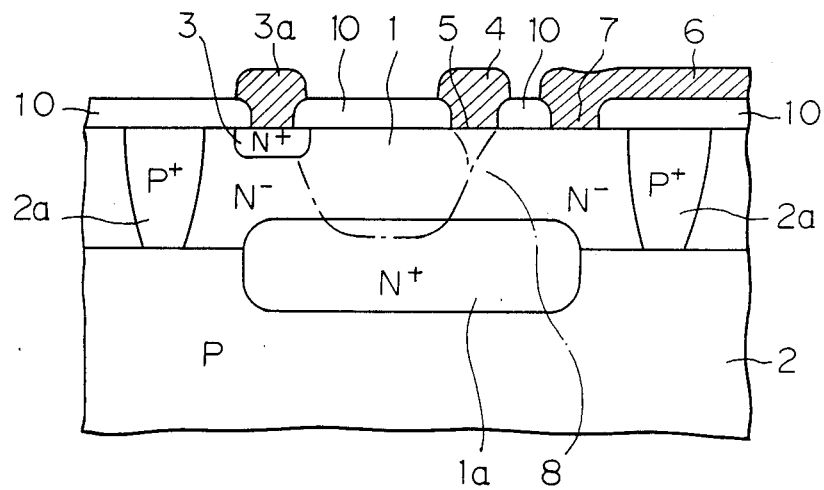
FIG. 2 is a section view taken on line II—II of FIG. 1.

FIG. 1 illustrates a circuit pattern of an input protection circuit used in a conventional TTL-type integrated circuit device, and FIG. 2 is a sectional view taken on line II—II of FIG. 1. In these drawings, reference numeral 1 designates an $N^-$-type epitaxial layer formed on a P-type substrate 2 and surrounded by $P^+$-type isolation layer 2a. Reference numeral 3 designates a contact portion, i.e., an $N^+$-type diffusion layer, and 3a designates an electrode connected to an external input terminal (not shown). 4 designates a metal conductor joined to the $N^-$-type epitaxial layer 1 at an electrode window 5 of an insulation layer 10 to form a Schottky barrier diode. Reference numeral 6 designates a metal conductor connected to an input terminal of an inner circuit (not shown). The metal conductor 6 is joined to the $N^-$-type epitaxial layer 1 at an electrode window 7 of the insulation layer 10 to form a Schottky barrier diode. The metal conductor 4 is electrically connected to the P-type substrate 2 or the $P^+$-type isolation layer 2a. Between the P-type substrate 2 and the $N^-$-type epitaxial layer 1 is formed an $N^+$-type buried layer 1a.

Figure 3:
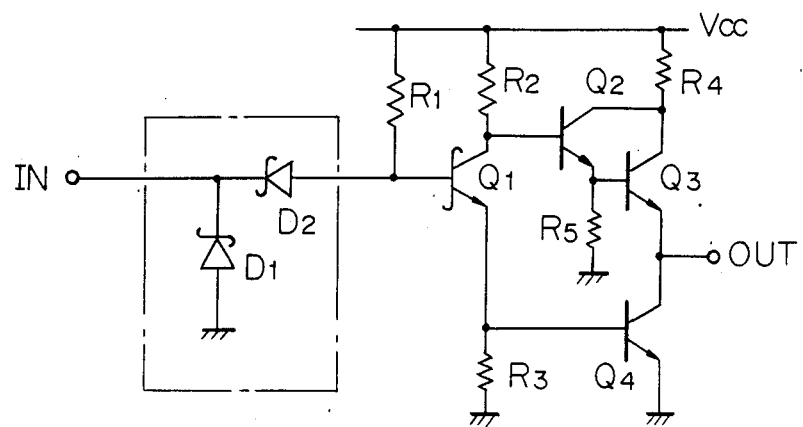
FIG. 3 is an electric circuit diagram illustrating an equivalent circuit of the device shown in FIG. 1.

FIG. 3 illustrates an equivalent circuit of the device shown in FIG. 1. In FIG. 3, a circuit surrounded by a chain line is an input circuit which corresponds to the device shown in FIG. 1. A Schottky barrier diode D1 is formed by the metal conductor 4 and the $N^-$-type epitaxial layer 1, and a Schottky barrier diode D2 is formed by the metal conductor 6 and the $N^-$-type epitaxial layer 1. The common cathode, i.e., the N-type epitaxial layer 1 of the Schottky barrier diodes D1 and D2, is connected to an external input terminal IN. The anode of the Schottky barrier diode D2 is connected to the base of a transistor Q1. The transistor Q1, transistors Q2 through Q4, resistors R1, R2, ..., R5 and so on, are the elements constituting a TTL circuit.

In FIG. 3, when a positive voltage having a voltage level approximately equal to the power supply voltage $V_{CC}$ is applied to the input terminal IN, both the Schottky barrier diodes D1 and D2 are turned off and the base voltage of the transistor Q1 is rendered high by the resistor R1. When the voltage at the external input terminal IN is zero volt, the diode D2 is turned on, and the base voltage of the transistor Q1 is pulled down to approximately zero volt. In this way, when the voltage of the external input terminal IN is approximately equal to the voltage between zero volt through $V_{CC}$, the voltage of the external input terminal IN is applied almost directly to the base of the transistor Q1, and the TTL circuit effects a usual logical operation. On the other hand, when a negative voltage is applied to the input terminal IN due to, for example, noise, the Schottky barrier diode D1 is turned on and the voltage of the external input terminal IN is prevented from falling below a voltage which is lower than the ground voltage by the forward bias voltage (approximately 0.3 through 0.4 V) of the Schottky barrier diode D1, thereby protecting the internal circuit. When a high positive voltage is applied to the external input terminal IN due to, for example, electrostatic voltage, the Schottky barrier diode D1 enters a breakdown state, thereby protecting the internal circuits by preventing the application of a high voltage to the internal circuits.

However, in the above-mentioned conventional semiconductor device, if a high positive voltage is applied to the external input terminal IN, the Schottky barrier diode D1 is sometimes permanently destroyed and is short-circuited due to an excessive current flowing through the Schottky barrier diode D1.

Figure 4:
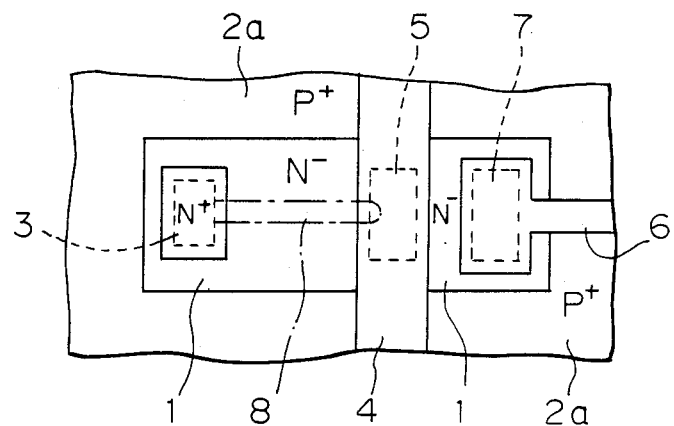
FIG. 4 is a plan view illustrating a defective short circuit condition in the device shown in FIG. 1.

The short-circuited condition is presumably caused, as shown by chain lines in FIG. 2, by the injection of conductor metal from the metal conductor 4 into the N⁻-type epitaxial layer 1, due to the excessive current flowing through the Schottky barrier diode D1. Therefore, a short-circuiting conductor portion 8 is formed from the metal conductor 4 into the N⁻-type epitaxial layer 1 toward the N+-type diffusion layer 3. As illustrated in FIG. 4, the short-circuiting portion 8 sometimes reaches from the metal conductor 4 to the N+-type diffusion layer 3 and to the electrode 3a. Thus, the diode junction between the metal conductor 4 and the N⁻-type epitaxial layer 1 is destroyed and is short circuited.

According to the present invention, there is provided a semiconductor device which overcomes these problems.

Figure 5:
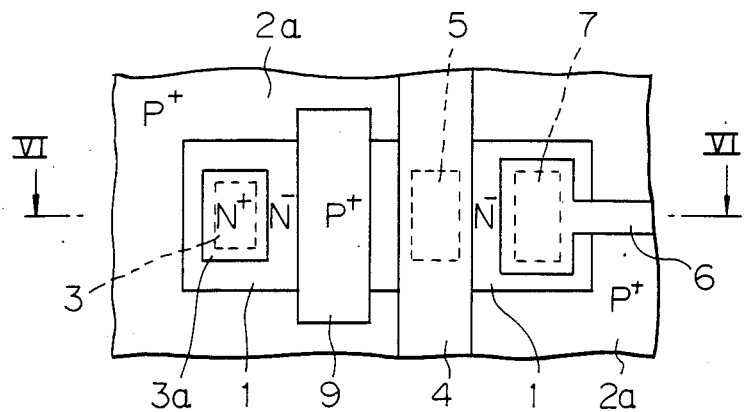
FIG. 5 is a plan view illustrating a structure of an input protection circuit portion of a semiconductor device as an embodiment of the present invention.
Figure 6:
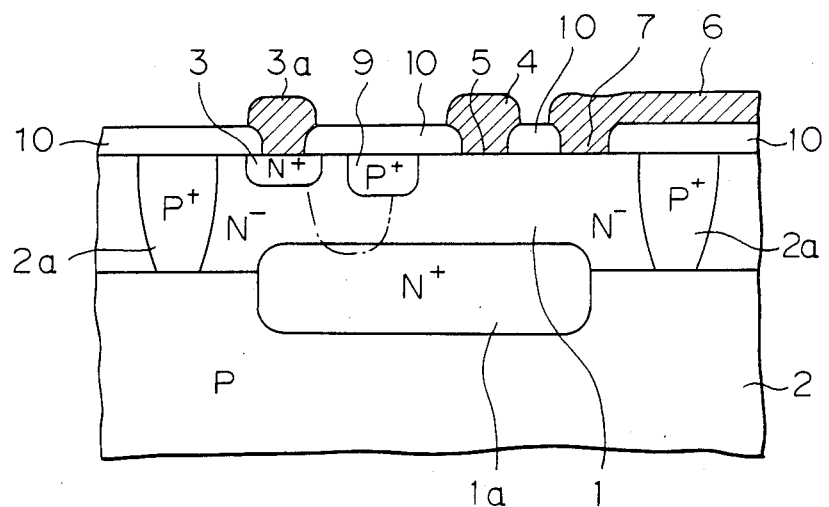
FIG. 6 is a section view taken on line VI—VI of FIG. 5.

FIG. 5 illustrates a structure of an input circuit of a semiconductor device as an embodiment of the present invention, and FIG. 6 is a sectional view taken on line VI—VI of FIG. 5. The device shown in FIG. 5 differs from that of FIG. 1 in that the device of FIG. 5 comprises a P+-type region 9 formed on an N⁻-type epitaxial layer 1 by the process of, for example, impurity difusion. The other portions of FIG. 5 are the same as those shown in FIG. 1 and designated by the same reference numerals. The P+-type region 9 is formed so that it crosses the N⁻-type epitaxial layer 1 between the N+-type diffusion layer 3 and the metal conductor 4, and at least one end of the P+-type region 9 is coupled to the P+-type isolation region 2a. The P+-type region 9 is covered by the insulation layer 10, formed thereon, and, therefore, does not contact any metal conductor.

The concentration of the impurity diffusion of the P+-type region 9 is larger than that of, for example, the P-type substrate 2, and the like. It is possible to make the reverse withstand voltage of a PN junction formed between the P+-type region 9 and the N⁻-type epitaxial layer 1 lower than the reverse withstand or breakdown voltage of the Schottky barrier diode D1 formed by the metal conductor 4 and the N⁻-type epitaxial layer 1, by increasing the concentration of the impurity diffusion of the P+-type region 9.

Figure 7:
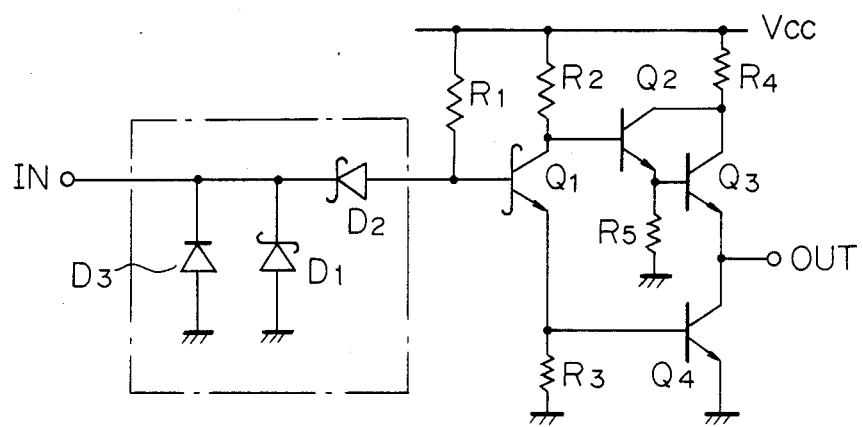
FIG. 7 is an electric circuit diagram illustrating an equivalent circuit of the device shown in FIG. 5.

FIG. 7 illustrates an equivalent circuit of the device shown in FIG. 5. In the circuit of FIG. 7, there is provided a PN diode D3 in parallel to the Schottky barrier diode D1. The diode D3 corresponds to the PN junction between the P+-type region 9 and the N⁻-type epitaxial layer 1 of FIG. 5, and the PN junction has no metal conductor.

In the circuit shown in FIG. 7, the usual operation effected in the condition a voltage between 0 through $V_{CC}$ is applied to an external input terminal IN and the operation effected when a negative voltage is applied to the external input terminal are the same as those of the circuit of FIG. 3. When a positive high voltage is applied to the external input terminal IN due to the electrostatic induction, the diode D3 first breaks down and then establishes a current path for a destruction current caused by the electrostatic induction, as shown by a chain line in FIG. 6, because the reverse withstand voltage of the diode D3 is lower than that of the Schottky barrier diode D1. Thereby avoiding destruction of the Schottky barrier diodes D1 and D2, and the like. In this case, since the diode D3 does not use a metal conductor, the diode D3 is not short circuited by the conductor metal even if an excessive current flows therethrough, and enters a cut-off state again when the high voltage in the external input terminal IN is removed.

In the embodiment shown in FIG. 5, since the P+-type region 9 is formed between the Schottky barrier diode formed by the metal conductor 4 and the N⁻-type epitaxial layer 1 and the input contact 3, it is possible to effectively absorb a high voltage applied to the input terminal IN.

As mentioned above, according to the present invention, it is possible to increase the withstand ability against the destruction caused, for example, by the electrostatic voltage applied to the input circuit of a semiconductor device, and to improve the reliability of the semiconductor device.

We claim:

1. A semiconductor device formed on a semiconductor substrate having a first conductivity type and having an input circuit for protecting an internal circuit, said input circuit comprising:
   a first impurity region having a second conductivity type connected to an external terminal and having an island-shape formed on said semiconductor substrate and surrounded by an isolation region having an opposite conductivity type;
   a clamp diode comprising an electrode layer in contact with said first impurity region; and
   a PN junction type protection diode comprising a second impurity region having said first conductivity type, said second impurity region crossing said first impurity region remote from said clamp diode electrode layer at a position between said clamp diode and a portion of said first impurity region connected to said external terminal and extending to said isolation region;
   the reverse withstand voltage of said PN junction type protection diode being smaller than that of said clamp diode, whereby excessive current flow through said clamp diode due to a high positive voltage applied to said external terminal is prevented.

2. A semiconductor device according to claim 1, wherein said clamp diode is a Schottky barrier diode connected in parallel to said PN junction type protection diode.

3. A semiconductor device according to claim 1, wherein said second impurity region of said PN junction type protection diode is covered by an insulation layer formed thereon.

4. A semiconductor device according to claim 1, wherein said second impurity region of said PN junction type protection diode reaches said isolation region at both ends.

5. A semiconductor device according to claim 1, wherein said input circuit is an input protection circuit of a TTL logic circuit.

6. A semiconductor device according to claim 1, wherein the output terminal of said input circuit is connected to said internal circuit via a diode.

7. A semiconductor device according to claim 6, wherein said diode connected between the output terminal of said input circuit and said internal circuit is a Schottky barrier diode.

* * * * *